United States Patent
Settle et al.

(10) Patent No.: US 7,073,116 B1
(45) Date of Patent: Jul. 4, 2006

(54) ERROR DETECTION/CORRECTION CODING FOR HIERARCHICAL QAM TRANSMISSION SYSTEMS

(75) Inventors: Timothy Forrest Settle, Cumming, GA (US); Thomas Peter Krauss, Algonquin, IL (US); Kumar Ramaswamy, Plainsboro, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 625 days.

(21) Appl. No.: 10/148,155

(22) PCT Filed: Nov. 22, 2000

(86) PCT No.: PCT/US00/32010

§ 371 (c)(1),
(2), (4) Date: Oct. 25, 2002

(87) PCT Pub. No.: WO01/39455

PCT Pub. Date: May 31, 2001

Related U.S. Application Data

(60) Provisional application No. 60/167,021, filed on Nov. 23, 1999.

(51) Int. Cl.
*H03M 13/03* (2006.01)
(52) U.S. Cl. .................................................. 714/786
(58) Field of Classification Search ............. 714/704, 714/755, 758, 786, 790, 792; 375/261, 341
See application file for complete search history.

(56) References Cited

U.S. PATENT DOCUMENTS

| 5,848,102 A | * | 12/1998 | Zehavi et al. ............ 375/261 |
| 5,966,412 A | * | 10/1999 | Ramaswamy ............ 375/341 |
| 6,038,696 A | * | 3/2000 | Chouly et al. ............ 714/786 |

FOREIGN PATENT DOCUMENTS

EP  594 505 A1  4/1994

OTHER PUBLICATIONS

L. Papke et al., "*Combined Multilevel Turbo-Code with MR-Modulation*", Seattle, Jun. 18-22, 1995, New York, IEEE, US, Jun. 18, 1995, pp. 668-672.
Search Report.

* cited by examiner

*Primary Examiner*—Albert Decady
*Assistant Examiner*—James C. Kerveros
(74) *Attorney, Agent, or Firm*—Joseph S. Tripoli; Joseph J. Laks; Ronald H. Kurdyla

(57) ABSTRACT

The power of the respective codes used by the first and second error detection/correction circuitry are such that the coded bit error rate of the first data stream is more closely matched to the coded bit error rate of the second data stream. A hierarchical QAM system allows the transmission of different sources by embedding the relative constellation points. The hierarchical QAM transmitter encodes the first data stream using a code having a first detection/correction power and encodes the second data stream using a code having a second detection/correction power.

19 Claims, 7 Drawing Sheets

| Level 1 Symbol | Level 2 Iout | Level 2 Qout |
|---|---|---|
| 0 | Iin | Qin |
| 1 | -Iin | Qin |
| 2 | Iin | -Qin |
| 3 | -Iin | -Qin |

US 7,073,116 B1

ERROR DETECTION/CORRECTION CODING FOR HIERARCHICAL QAM TRANSMISSION SYSTEMS

This application claims the benefit under 35 U.S.C. § 365 of International Application PCT/US00/32010, filed Nov. 22, 2000, which claims the benefit of U.S. Provisional Application 60/167,021, filed Nov. 23, 1999.

FIELD OF THE INVENTION

The present invention relates to hierarchical quadrature amplitude modulation transmission systems.

BACKGROUND OF THE INVENTION

Hierarchical quadrature amplitude modulation (QAM) transmission systems are well known. For example, U.S. Pat. No. 5,966,412, issued Oct. 12, 1999 to Ramaswamy, discloses a modulation system which can remain backward compatible with older quadrature phase shift keyed (QPSK) receivers, while simultaneously further allowing additional data streams, for providing higher data rates or higher precision data, to be receivable by more advanced receivers. FIG. 1 is a block diagram illustrating a hierarchical QAM transmission system as disclosed in this patent. FIG. 1 discloses a data transmitter 100 coupled to a data receiver 300 via a transmission channel 200.

In FIG. 1, a first input terminal DATA 1 is coupled to source (not shown) of a first data signal, and a second input terminal DATA 2 is coupled to a source (not shown) of a second data signal. The first and second data signals may represent separate and independent data, or may represent related data signals, such as signals carrying respective portions of the same data signal (for increasing the throughput of the transmission system) or a elementary data portion and a supplemental data portion of the same data signal (for transmitting enhanced signals while maintaining backward compatibility with existing older receivers, as described in more detail below). The first input terminal DATA 1 is coupled to an input terminal of a first error detection/correction encoder 102. An output terminal of the first encoder 102 is coupled to an input terminal of a level 1 QPSK modulator 104. An output terminal of the level 1 QPSK modulator 104 is coupled to a first input terminal of a signal combiner 106.

The second input terminal DATA 2 is coupled to an input terminal of a second error detection/correction encoder 108. An output terminal of the second encoder 108 is coupled to an input terminal of a level 2 QPSK modulator 110. The level 2 QPSK modulator 110 is coupled to an input terminal of a variable gain amplifier 111, having a gain of G. An output terminal of the variable gain amplifier 111 is coupled to a second input terminal of the signal combiner 106. An output terminal of the signal combiner 106 produces a combined modulated signal and is coupled to the transmission channel 200. In the illustrated embodiment, this channel is a direct satellite television signal transmission system, and the transmission channel includes a ground transmitting station at the transmitter 100 (represented by a transmitting antenna in phantom), a communications satellite (not shown), for receiving the data from the ground station and rebroadcasting that data to a plurality of ground receiving stations, one of which (300) is illustrated in FIG. 1, which receives and processes the rebroadcast data signal, as illustrated by a receiving antenna in phantom.

The output of the transmission channel 200 is coupled to an input terminal of a level 1 QPSK demodulator 302. An output terminal of the level 1 demodulator 302 is coupled to respective input terminals of a first error detection/correction decoder 304 and a delay circuit 306. An output terminal of the first decoder 304 is coupled to an output terminal DATA 1', and to an input terminal of a reencoder 308. An output terminal of the reencoder 308 is coupled to an subtrahend input terminal of an subtractor 310. An output terminal of the delay circuit 306 is coupled to a minuend input terminal of the subtractor 310. A difference output terminal of the subtractor 310 is coupled to an input terminal of a second error detection/correction decoder 312. An output terminal of the second decoder 312 is coupled to a second data output terminal DATA 2'.

In operation, the first encoder 102 encodes the first data signal DATA 1 to provide error detection/correction capabilities in a known manner. Any of the known error detection/correction codes may be implemented by the encoder/decoder pairs 102/304, 108/312, and those codes may be concatenated, as described in the above mentioned patent. The first encoder 102 produces a stream of encoded bits representing the encoded first data signal DATA 1. The level 1 modulator 104 processes successive sets of two encoded data bits, each set termed a symbol, to generate a QPSK signal which lies in one of four quadrants in a known manner. Similarly, the second encoder 108 encodes the second data signal DATA 2 to provide error detection/correction capabilities in a known manner. The level 2 modulator 110 processes sets of two encoded data bits to also generate a QPSK signal which lies in one of four quadrants. One skilled in the art will understand that additional data signals (DATA 3, etc.) may be respectively error detection/correction encoded by additional encoders and additional QPSK modulators, (level 3, etc.) may be responsive to respective additional sets of two encoded data bits to generate additional QPSK signals. The QPSK signal from the level 1 modulator 104 is given a weight of 1; the QPSK signal from the level 2 modulator 110 is given a weight or gain of 0.5 by the variable gain amplifier 111; the third a weight of 0.25 and so forth. All the weighted QPSK signals are then combined into a single modulated signal by the signal combiner 106 and transmitted through a transmission channel 200.

The level 1 QPSK modulator 104 causes the combined signal to lie within one of four quadrants in response to the set of two encoded data bits from the first encoder 102. Each quadrant, in turn, may be thought of as divided into four sub-quadrants. The level 2 QPSK modulator 110 causes the combined signal to lie within one of the sub-quadrants within the quadrant selected by the level 1 QPSK modulator 104, in response to the set of two input data bits from the second encoder 108. That sub-quadrant may further be though of as divided into four sub-sub-quadrants, and the combined signal caused to lie within one of those sub-sub-quadrants in response to the set of two input data bits from a third encoder (not shown), and so forth.

An older receiver (illustrated in FIG. 1 by a dashed line 300') includes only a level 1 QPSK demodulator 302, which can detect where in the I–Q plane the received signal lies. From that information, the error detection/correction decoder 304 can determine the corresponding two encoded bits in the received first data stream. The error detection/correction decoder 304 can further correct for any errors introduced by the transmission channel to generate a received data signal DATA 1' representing the original first data signal DATA 1. Thus, such a receiver can properly receive, decode, and process a first data signal DATA 1 in the presence of additionally modulated data signals DATA 2, (DATA 3), etc. The signals included by the level 2 (and level 3, etc.) QPSK modulators look simply like noise to such a receiver.

A more advanced receiver 300, on the other hand, can detect which quadrant the received modulated signal lies within, and, thus, can receive, decode, and process successive sets of two data bits representing the first data signal DATA 1. The reencoder 308 in the advanced receiver then regenerates an ideal signal lying in the middle of the indicated quadrant, which is subtracted from the received modulated signal. This operation translates the center of the transmitted signal quadrant to the origin. What remains is a QPSK modulated signal, weighted by 0.5, representing the second data signal DATA 2. This signal is then decoded by the second decoder 312 to determine which sub-quadrant the signal lies within, indicating the set of two bits corresponding to that signal. Successive sets of two received data bits representing the second data signal DATA 2 are, thus, received, decoded and processed, and so forth. Such a transmission system operates by modulating a carrier in quadrature with what is seen as a constellation of permissible symbols, and is a form of quadrature amplitude modulation (QAM). Such a system is termed a hierarchical QAM transmission system because it may be used to transmit other levels of data signals, or other levels of detail in a single signal, while maintaining backwards compatibility with older receivers.

FIG. 2*a* is a diagram illustrating a constellation in the I–Q plane of permissible symbols for a hierarchical 16 QAM transmission system, as illustrated in the above mentioned patent. In FIG. 2*a*, a first set of two bits determine which quadrant the generated symbol lies within. If the first two bits are "00" then the symbol lies within the upper right hand quadrant, and the level 1 modulator 104 produces I–Q signals such that I=1 and Q=1; if the first two bits are "01" then the symbol lies within the upper left hand quadrant, and the level 1 modulator 104 produces I–Q signals such that I=−1 and Q=1; if the first two bits are "10" then the symbol lies within the lower right hand quadrant and the level 1 modulator 104 produces I–Q signals such that I=1 and Q=−1; and if the first two bits are "11" then the symbol lies within the lower left hand quadrant and the level 1 modulator 104 produces I–Q signals such that I=−1 and Q=−1. This is indicated in FIG. 2*a* by the appropriate bit pair in the middle of the associated quadrant.

As described above, each quadrant may, itself, be considered to be divided into four sub-quadrants, as illustrated in the upper right hand quadrant in FIG. 2*a*. The second set of two bits determine which sub-quadrant the symbol lies within. The same mapping is used for determining the sub-quadrant as was described above for determining the quadrant. That is, if the second two bits are "00", then the symbol lies within the upper right hand sub-quadrant and the level 2 modulator generates an I–Q signal such that I=1 and Q=1; if the second two bits are "01" then the symbol lies within the upper left hand sub-quadrant and the level 2 modulator generates an I–Q signal such that I=−1 and Q=1; if the second two bits are "10" then the symbol lies within the lower right hand sub-quadrant and the level 2 modulator generates an I–Q signal such that I=−1 and Q=−1; and if the second two bits are "11" then the symbol lies within the lower left hand sub-quadrant and the level 2 modulator generates an I–Q signal such that I=−1 and Q=−1. The variable gain amplifier 111 (of FIG. 1) weights the signal from the level 2 modulator 110 by a weight of 0.5, so the points in the sub-quadrants lie at ±0.5 around the center point of the quadrant. Each of these locations is shown as a solid circle in FIG. 2*a*, with a four bit binary number illustrating the combination of the first and second sets of two bits, with the first two bits being the right hand pair of bits and the second two bits being the left hand pair.

It is known that the bit error rate performance of the respective data streams through the different levels of a hierarchical QAM system such as described above are different. In general, the bit error rate of the level 1 data stream is better than the bit error rate of the level 2 (and higher) data streams. However, the overall performance of the hierarchical QAM transmission system is optimized when the bit error rate of the respective data streams through the different levels are the same. It is desirable, therefore, to optimize not only the overall bit error rate of the transmission system, but also to more closely match the respective bit error rates of the different levels in the transmission system.

SUMMARY OF THE INVENTION

The inventors have realized that the different levels of QPSK modulation suffer from differing levels of degradation. This is exacerbated in a direct satellite television transmission system because of the non-linear high powered amplifiers employed in satellite broadcasting. Such amplifiers tend to compress the distance between the constellation points in the higher levels of modulation. The inventors realized that this leads to higher bit error rates in the higher level data streams, compared to the lower level streams.

In accordance with principles of the present invention a hierarchical QAM transmission system includes a hierarchical QAM transmitter, responsive to a first and a second data stream. The hierarchical QAM transmitter transmits a hierarchical QAM signal consisting of a level 1 signal, representing the first data stream, and having an uncoded first bit error rate performance; and a level 2 signal, representing the second data stream, and having an uncoded second bit error rate performance lower than the first bit error rate performance. A hierarchical QAM receiver is coupled to the hierarchical QAM transmitter. The hierarchical QAM receiver receives the hierarchical QAM signal and produces first and second received data streams. First error detection/correction circuitry processes the first data stream by encoding the first data stream using a code having a first detection/correction power. Second error detection/correction circuitry processes the second data stream by encoding the second data stream using a code having a second error detection/correction power. The power of the respective codes used by the first and second error detection/correction circuitry are such that the coded bit error rate of the first data stream is more closely matched to the coded bit error rate of the second data stream.

DETAILED DESCRIPTION

Figure 1:
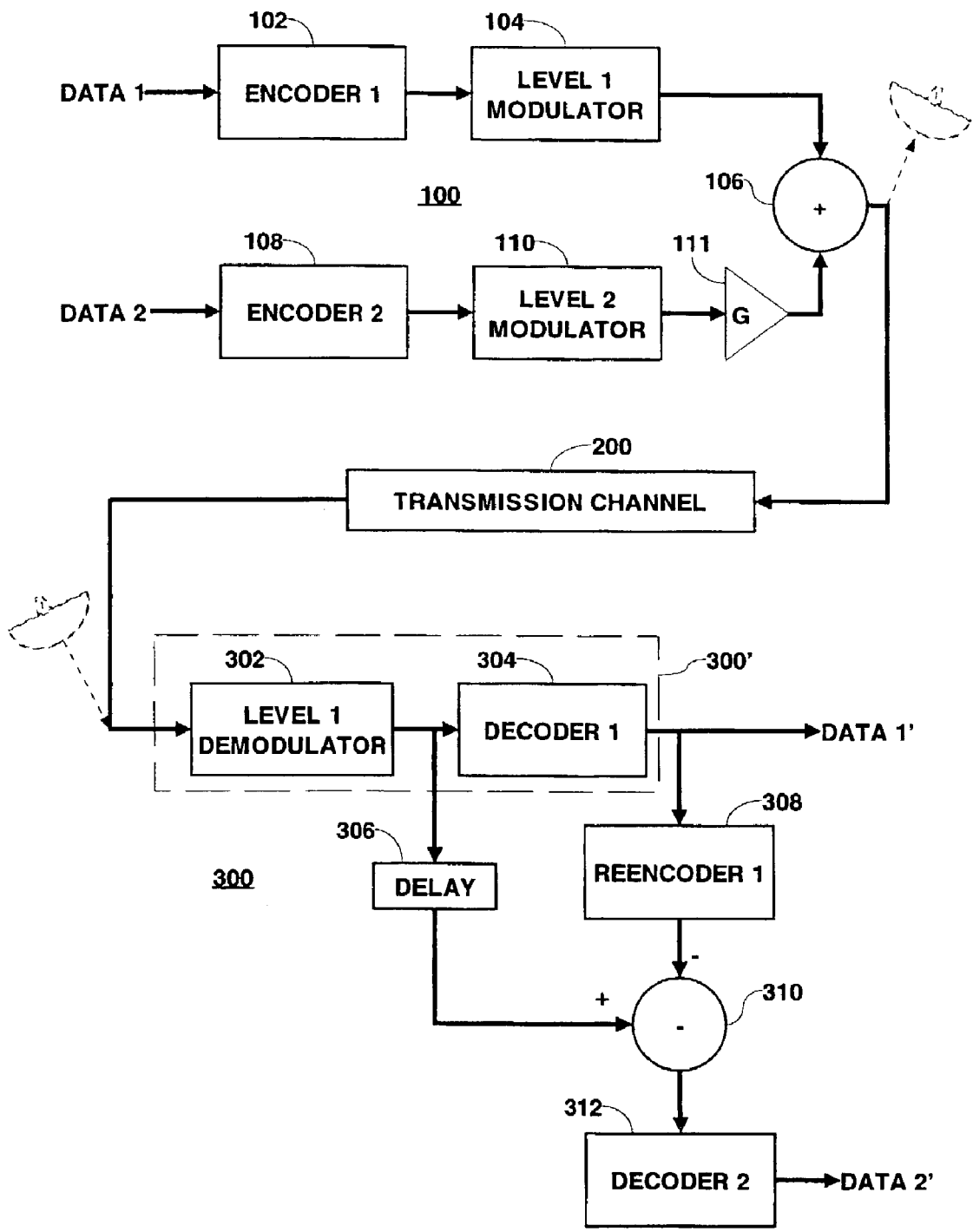
FIG. 1 is a block diagram of a transmission system in accordance with principles of the present invention.
Figure 2:
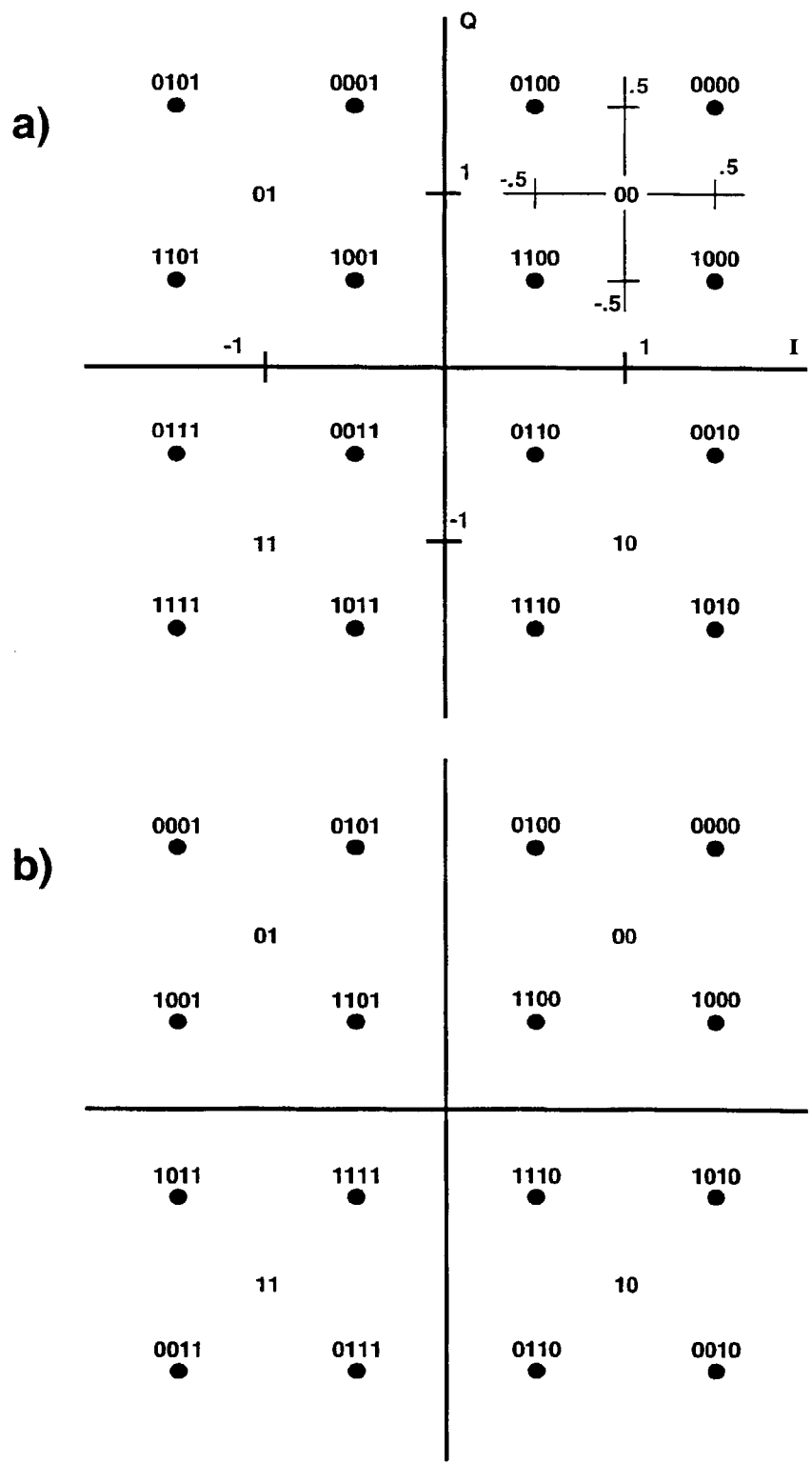
FIG. 2 is a diagram illustrating a constellation of permissible symbols for a hierarchical 16 QAM transmission system.
Figure 3:
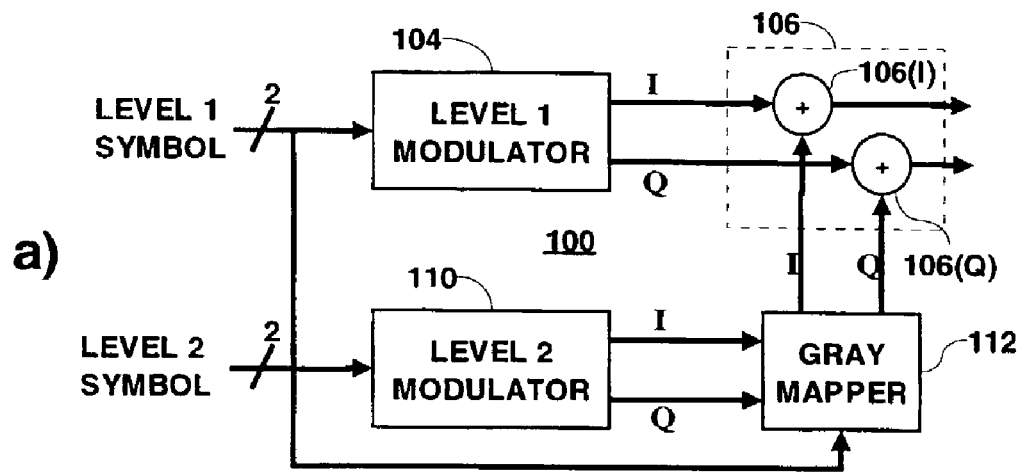
FIGS. 3*a* and *c* are more detailed block diagrams of respective portions of the transmission system illustrated in FIG. 1 and further including a gray code mapper.
FIG. 3*b* is a table containing data controlling the operation of the gray code mapper.
Figure 3:
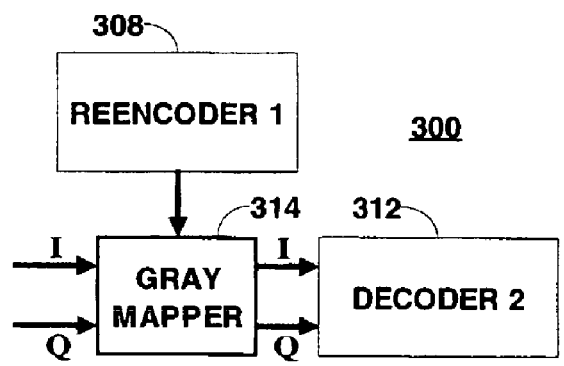

FIGS. 3a and c are more detailed block diagrams of respective portions of the transmission system illustrated in FIG. 1 and further including a gray code mapper, and FIG. 3b is a table illustrating the operation of the gray code mapper illustrated in FIGS. 3a and c. Referring first to FIG. 2b, a constellation in which adjacent points at all locations represent data values which differ in only one bit position is illustrated. To produce this constellation, the mapping of the set of two bits in the encoded level 2 data signal to locations in a sub-quadrant depends on which quadrant that sub-quadrant lies within. The upper right hand quadrant (00) in FIG. 2b is identical to that in FIG. 2a. In the upper left hand quadrant, however, the left and right columns are switched. In the lower right hand quadrant, the top and bottom rows are switched, and in the lower left hand quadrant, the left and right hand columns and the top and bottom rows are switched. This may be performed by a simple mapping operation in the transmitter 100 prior to modulating the encoded second data signal DATA 2, and then a simple demapping operation in the receiver 300 after the received encoded second data signal is demodulated.

In FIG. 3a, a portion of the transmitter 100 is illustrated. A level 1 symbol (two bits from the first encoder 102 of FIG. 1) is coupled to respective input terminals of the level 1 modulator 104 and a gray code mapper 112. An in-phase (I) signal from the level 1 modulator 104 is coupled to a first input terminal of a first adder 106(I) and a quadrature (Q) signal from the level 1 modulator 104 is coupled to a first input terminal of a second adder 106(Q). The combination of the first adder 106(I) and the second adder 106(Q) form the signal combiner 106 of FIG. 1. A level 2 symbol (two bits from the second encoder 108) is coupled to an input terminal of the level 2 modulator 110. An I output terminal of the level 2 modulator 110 is coupled to an I input terminal of the gray code mapper 112, and a Q output terminal of the level 2 modulator 110 is coupled to a Q input terminal of the gray code mapper 112. An I output terminal of the gray mapper 112 is coupled to a second input terminal of the first adder 106(I) and a Q output terminal of the gray mapper 112 is coupled to a second input terminal of the second adder 106(Q). The variable gain amplifier 111, conditioned to have an attenuation factor of 0.5 and coupled between the gray code mapper 112 and the signal combiner 106, is not shown to simplify the figure.

In operation, the level 1 symbol, represented by the set of two encoded data bits, is received from the level 1 encoder 102 (of FIG. 1). The level 1 symbol is QPSK modulated by the level 1 modulator 104 to generate a set of I and Q component signals representing the quadrant of the modulated signal in a known manner. For example, if the symbol is 0, i.e. the two bits are 00, then the upper right hand quadrant is indicated (I=1, Q=1); if the symbol it 1, i.e. the two bits are 01, then the upper left hand quadrant is indicated (I=−1, Q=1); if the symbol is 2, i.e. the two bits are 10, then the lower right hand quadrant is indicated (I=1, Q=−1); and if the symbol is 3, i.e. the two bits are 11, then the lower left hand quadrant is indicated (I=−1, Q=−1). In a similar manner, level 2 symbol is QPSK modulated by the level 2 modulator 110 to generate a set of I and Q component signals representing the sub-quadrant of the modulated signal in a known manner. The level 2 modulator generates the modulated signal in exactly the same manner as the level 1 modulator 104, i.e. if the two bits are 00 (O), then the upper right hand sub-quadrant is indicated (I=1, Q=1); if the two bits are 01 (1), then the upper left hand sub-quadrant is indicated (I=−1, Q=1); if the two bits are 10 (2) then the lower right hand sub-quadrant is indicated (I=−1, Q=1); and if the two bits are 11 (3) then the lower left hand sub-quadrant is indicated (I=−1, Q=−1). This modulated signal is then weighted by 0.5 (not shown).

The resulting constellation from the combination of these two modulated signals would be as illustrated in FIG. 2a. The gray code mapper 112 operates on the I and Q signals from the level 2 modulator 110 to produce the constellation illustrated in FIG. 2b. FIG. 3b illustrates the mapping applied by the gray code mapper 112. If the level 1 symbol is 0, indicating the upper right hand quadrant, then the sub quadrants are unchanged, that is the I and Q output signals from the level 2 modulator are left unchanged. Thus, the I output signal, Iout from the gray code mapper 112 is the same as the I input signal Iin (Iout=Iin), and the Q output signal, Qout from the gray code mapper 112 is the same as the Q input signal Qin (Qout=Qin). If, however the level 1 symbol is 1, indicating the upper left hand quadrant, then, referring to FIG. 2, the columns are switched. That is, positive I values become negative and vice versa. Thus when the level 1 symbol is 1, the I output signal is the negative of the I input signal (Iout=−Iin), while the Q output signal remains the same as the Q input signal (Qout=Qin). If the level 1 symbol is 2, indicating the lower right hand quadrant, then, the rows are switched. That is, positive Q values become negative and vice versa. Thus, when the level 1 symbol is 2, the I output signal is the same as the I input signal (Iout=Iin), while the Q output signal is the negative of the Q input signal (Qout=−Qin). If the level 1 signal is 3, indicating the lower left hand quadrant, then, both the columns and the rows are switched. That is, positive I values become negative, and positive Q values become negative, and vice versa. Thus, when the level 1 symbol is 3, the I output signal is the negative of the I input signal (Iout=−Iin), and the Q output signal is the negative of the Q input signal (Qout=−Qin). The gray code mapper 112 provides this function. The resulting I and Q values from the gray code mapper 112 are weighted with a weight of 0.5 as described above (not shown for simplicity) and combined by the signal combiner 106 with the I and Q values representing the level 1 symbol. The resulting constellation is that illustrated in FIG. 2b.

Such a mapping is reversible in the receiver 300 using a similar gray code mapper. FIG. 3c illustrates a portion of a receiver 300 including such a gray code mapper 314. In FIG. 3c, the output terminal of the reencoder 308 is coupled to an input terminal of the gray code mapper 314. An I signal from the subtractor 310 (of FIG. 1) is coupled to an I input terminal of the gray code mapper 314 and a Q signal from the subtractor 310 is coupled to a Q input terminal of the gray mapper 314. An I output terminal of the gray code mapper 314 is coupled to an I input terminal of the second decoder 312 and a Q output terminal of the gray code mapper 314 is coupled to a Q input terminal of the second decoder 312.

In operation, the reencoder 308 generates a signal which is an ideal representation of the received level 1 symbol. That is, if the received level 1 signal is determined to lie anywhere in the upper right hand quadrant, then the reencoder 308 produces a signal having the value 0; if anywhere in the upper left hand quadrant a value 1, if anywhere in the lower right hand quadrant a value 2 and if anywhere in the lower left hand quadrant a value 3. This symbol is supplied to a gray code mapper 314. Respective I and Q signals from the subtractor 310 are processed by the gray code mapper 314 in the manner described above, and illustrated in FIG. 3b. One skilled in the art will appreciate that the gray code mapper 314 in the receiver 300 operates identically to the gray code mapper 112 in FIG. 3a, and will perform the inverse function performed in the transmitter 100.

The use of gray code mappers (112 and 312) in the transmitter 100 and receiver 300 allow use of a constellation as illustrated in FIG. 2b, in the manner described above with respect to FIG. 3a. A transmission system using the gray code mapping function described above, to produce a constellation in which adjoining constellation points differ by no more than a single bit will increase the bit error rate of the system. Simulations have shown that using gray coding as described above will cut the number of level 2 bit errors in half. This provides an extra margin in the signal to noise ratio (SNR) of around ¼ dB. This improvement, while modest, will, along with other enhancements, provide improved performance of the transmission system as a whole.

Figure 4:
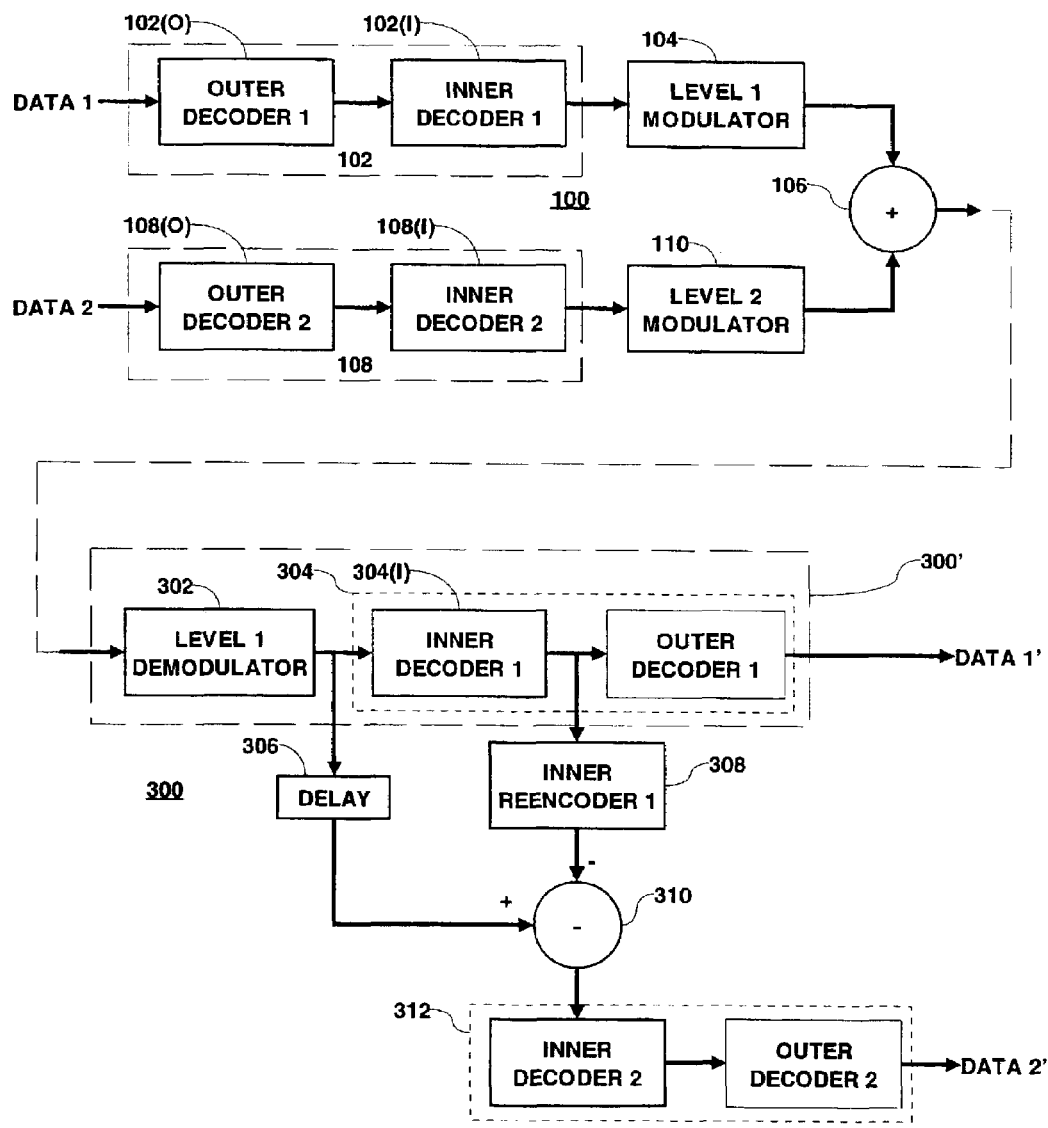
FIG. 4 is a more detailed block diagram of a portion of the transmission system illustrated in FIG. 1 illustrating the operation of differing error detection/correction codes for differing levels.

FIG. 4 is a more detailed block diagram of a portion of the transmission system illustrated in FIG. 1 illustrating the operation of differing error detection/correction codes for differing levels. As described above, different levels of QPSK modulation suffer from differing levels of degradation due to the compression of the distance between the constellation points in the higher levels of modulation by the non-linear high powered amplifiers employed in satellite broadcasting. More specifically, bit errors inherently occur more often at higher levels of the hierarchical modulation than lower levels. To more closely match the bit error rates of the level 1 and level 2 signals, error detection/correction codes having differing performance characteristics are used in the respective data streams. More specifically, more powerful error detection/correction coding will be used in higher level data streams while less powerful error detection/correction coding will be used on lower level data streams. This will optimize the overall performance and information transmission capacity of the transmission system.

In FIG. 4, those elements which are the same as those illustrated in FIG. 1 are designated with the same reference number and are not described in detail below. In FIG. 4, the first error detection/correction encoder 102 in the transmitter 100 is partitioned into a serial connection of an outer encoder 102(O) and an inner encoder 102(I). Similarly, the second error detection/correction encoder 108 is partitioned into a serial connection of an outer encoder 108(O) and an inner encoder 108(I). In a corresponding manner, the first error detection/correction decoder 304 in the receiver 300 is partitioned into a serial connection of an inner decoder 304(I) and an outer decoder 304(O). Similarly, the second error detection/correction decoder 312 is partitioned into a serial connection of an inner decoder 312(I) and an inner encoder 312(O). As disclosed in the above mentioned patent, the outer encoder/decoder pairs implement a block coding technique, such as Hamming codes, Hadamard codes, Cyclic codes and Reed-Solomon (RS) codes, while the inner encoder/decoder pairs implement a convolutional code.

In FIG. 4, the coding used for the level 2 data stream is more powerful than the coding used for the level 1 data stream. More specifically, the convolutional code used in the inner encoder/decoder pair in the level 2 data stream is more powerful than the convolutional code used in the inner encoder/decoder pair in the level 1 data stream. For example, in a preferred embodiment, the first inner encoder/decoder pair, processing the level 1 data stream, implements a rate ½, constraint length 7 convolutional code punctured to a rate of ☐. The second inner encoder/decoder pair, processing the level 2 data stream, implements a rate ½ convolutional code without puncturing. The coding of the level 2 data stream is more powerful than that of the level 1 data stream. This more closely matches the bit error rate performance of the level 1 and level 2 data streams, and optimizes the performance of the transmission system as a whole.

As described above, and illustrated in FIG. 1, the level 1 demodulator 302 and decoder 304 cooperate to detect the DATA 1 signal from the received constellation. Then a reconstructed ideal signal, from reencoder 308, representing this detected DATA 1 signal is then subtracted from the received constellation, and ideally results in translation of the received constellation to form another constellation of the sub-quadrants within the detected quadrant. However, this translation operation is very sensitive to any mismatch between the actual "center point" of the quadrant as received, and the ideal center point (displaced by ±1 from the origin of the level 1 constellation) assumed by the reencoder 308. Any mismatch in size between the received constellation and the ideal constellation results in the actual center point of the received quadrant being displaced from the assumed center point, and when the received constellation is translated by the reencoder 308 and subtractor 310, results in the actual center point of the displaced sub-quadrant being displaced from the origin assumed by the second decoder 312. Thus, the gain of the received channel must be accurately adapted to, in order to place the center point of the sub-quadrant in the proper location (origin) to be accurately decoded by the second decoder 312.

In known transmission systems, the gain of the system is determined by comparing the received constellation of data points to a known ideal constellation of data points. There are several problems associated with accurate maintenance of the gain in this manner, however. First, in some transmission systems, the locations of the constellation points may be deliberately distorted from their ideal locations. The resulting constellation does not have the equi-spaced points illustrated in FIG. 2. Second, the transmission channel is not constant, and may be noisy with varying amounts of non-linearity. To determine the location of the center point of the quadrants, and thus the gain of the system, in such systems, the center-of-gravity of all the data points in the quadrants is determined.

Figure 7:
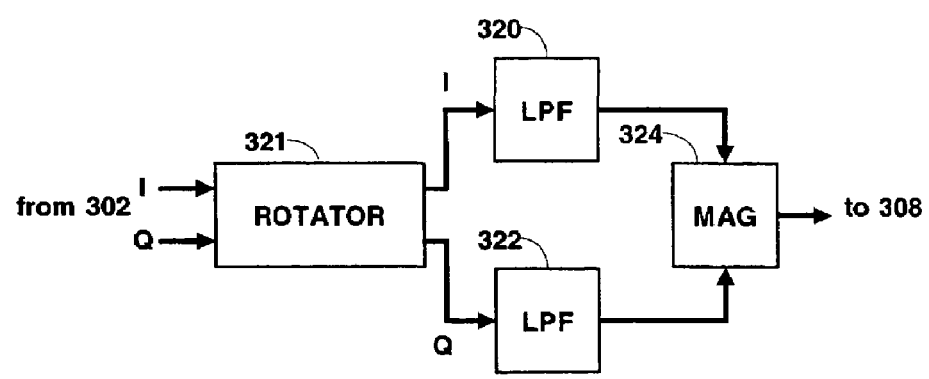
FIG. 7 is a block diagram of circuitry for determining the center of gravity of a quadrant of a received constellation of data points.

FIG. 7 is a block diagram of circuitry for determining the center of gravity of a quadrant of a received constellation of data points. In FIG. 7, a rotator 321 receives I and Q values representing I and Q components of successive received data points from the level 1 demodulator 302 (of FIG. 1). An I output terminal of the rotator 321 is coupled to an input terminal of an I low pass filter (LPF) 320. A Q output terminal of the rotator 321 is coupled to an input terminal of a Q LPF 322. Respective output terminals of the I and Q LPFs, 320 and 322, are coupled to corresponding input terminals of a magnitude calculating circuit 324. An output terminal of the magnitude calculating circuit 324 is coupled to the reencoder 308.

Figure 5:
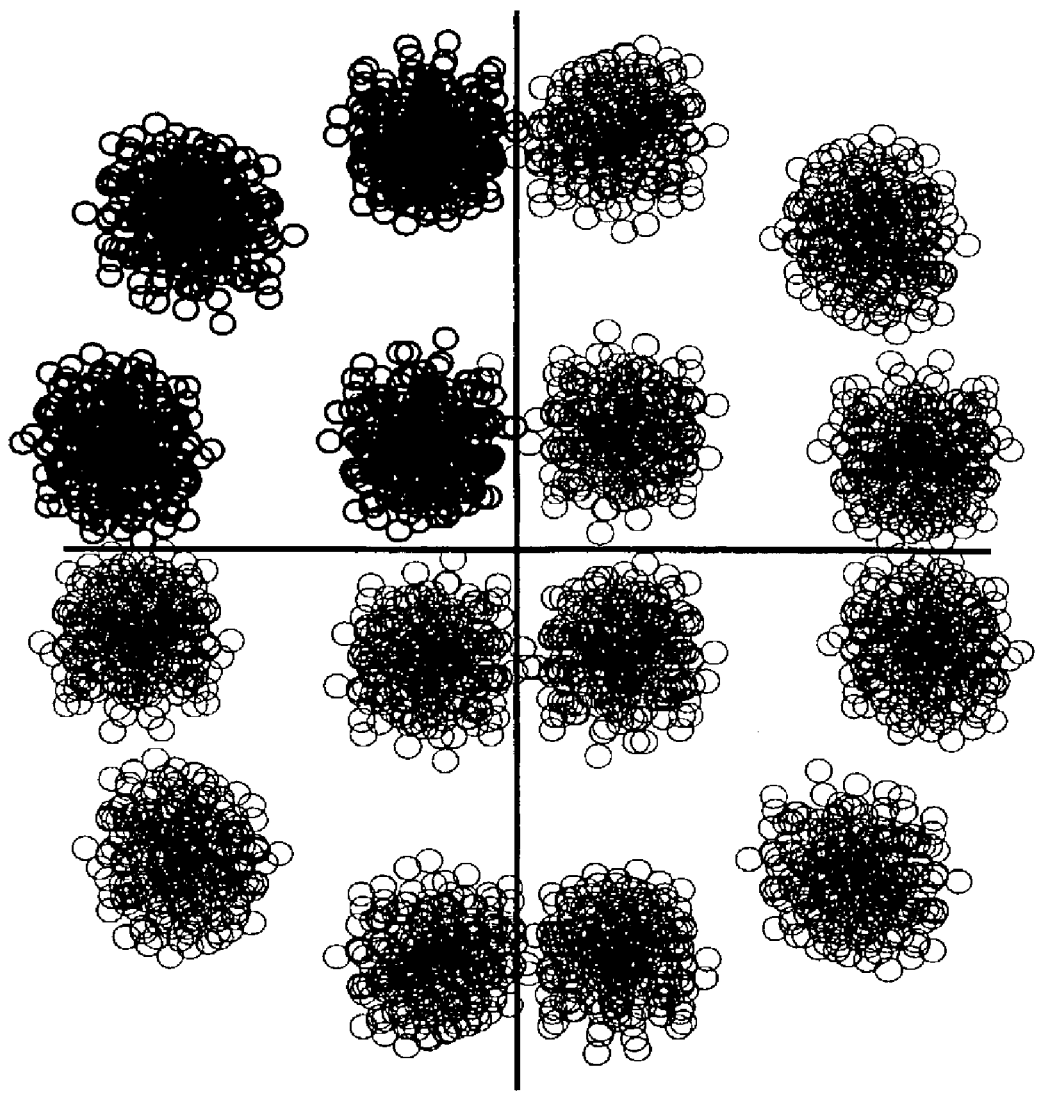
FIG. 5 is a diagram of a received constellation and FIG. 6 is a diagram of one quadrant of a received constellation distorted by the transmission channel.
Figure 6:
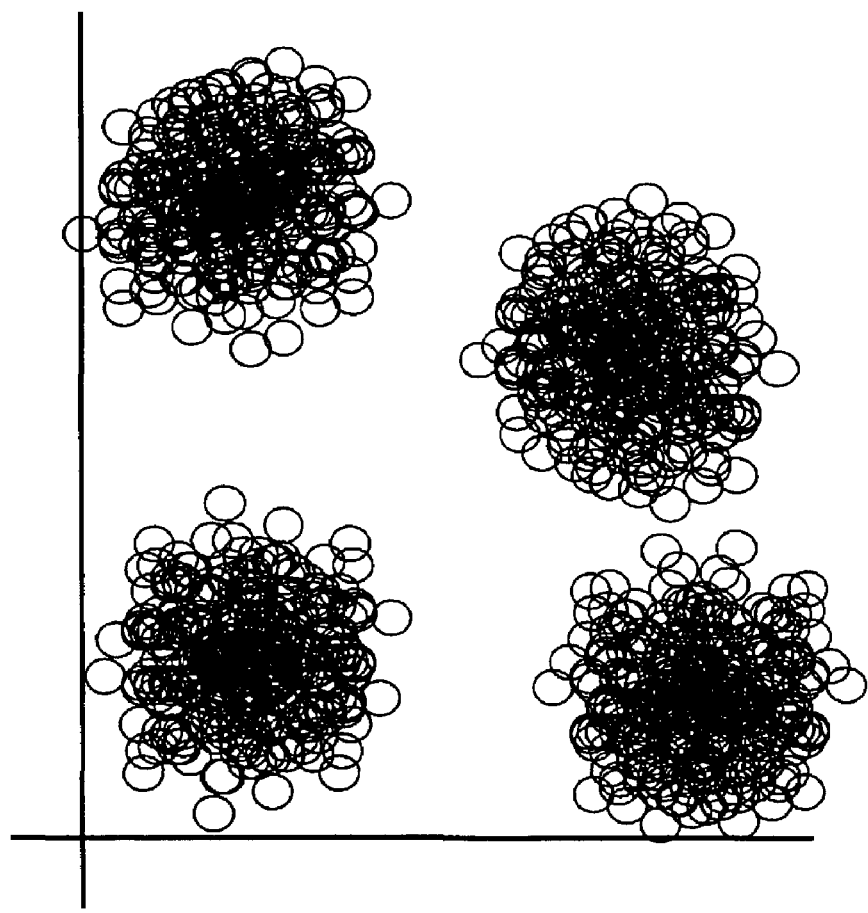

In operation, the rotator 321 rotates all of the received values from whatever quadrant they were received in to the upper right hand quadrant in a known manner. FIG. 5 is a diagram of a received constellation and shows the locations of a plurality of successive received modulated data points. The received data points form scatters in the respective neighborhoods of the assumed locations of the received constellation points in all four quadrants. FIG. 6 is a diagram of the upper right hand quadrant of a received constellation all of whose data points have been rotated to this quadrant by the rotator 321. The quadrant illustrated in FIG. 6 represents a constellation which has been distorted by either deliberate pre-distortion of the transmitted constellation points and/or by the operation of the transmission channel 200.

The I component of the rotated data points from the rotator 321 is low pass filtered in the LPF 320 with a sliding moving average of n points. In the illustrated embodiment, the sliding moving average is calculated using the preceding 500 data points. The Q component of the rotated data points from the rotator 321 is similarly low pass filtered with a sliding moving average. One skilled in the art will understand that the low pass filters 320, 322 may also be constructed using respective IIR digital filters. The low pass filtering operation produces the respective I and Q components of the center of gravity of the received data points in the quadrant. The estimate of the magnitude of the center of gravity is calculated in the magnitude calculating circuit 324. For example if $r_i[n]$ is the filtered in-phase I component, and $r_q[n]$ is the filtered quadrature Q component, then the magnitude of the center of gravity is calculated as $M = \sqrt{r_i[n]^2 + r_q[n]^2}$. The magnitude of the center of gravity M should ideally be $\sqrt{2}=1.4$. The magnitude of the ideal reconstructed signal from the reencoder 308 is adjusted in response to the magnitude of the calculated center of gravity M. By properly adjusting the magnitude of the reconstructed ideal signal from the reencoder 308, the centers of the respective received quadrants will be properly translated to the origin by the subtractor 310, and allow for accurate decoding of the level 2 and higher data signals.

The circuit illustrated in FIG. 7 will operate independently of the method of transmission, whether linear or non-linear. It also operates properly in the presence of a pre-distorted transmission constellation, or with non-standard grouping factors (described in more detail below). It has been found that the circuit works well in practice with no measurable degradation when used on hierarchical 16 QAM transmission system over a linear channel when compared with exact knowledge of the locations of the centers of the quadrants. The circuit also operates well in the presence of noise and in particular in the presence of channel distortion caused by non-linear channels, such as found in direct satellite television signal transmission systems. Such a circuit improves the performance of the higher level data streams, and thus, improves the overall performance of the transmission system.

Referring again to FIG. 1, in known hierarchical QAM transmission systems, the constellation generated by the level 2 modulator 110 is combined in the signal combiner 106 with the constellation generated by the level 1 modulator 104 after being weighted in the variable gain amplifier 111 by a factor of 0.5. The weighting factor of 0.5 is termed the grouping factor and may be varied to change the relative performance of the level 1 and level 2 data streams, as described in more detail below. Referring to FIG. 2a, the resulting constellation consists of equispaced constellation points. As described above, such an arrangement results in a transmission system in which the performance of the level 1 data stream, in terms of bit error rate, is better than that of the level 2 data stream. By varying the grouping factor, the relative performance of the level 1 and level 2 data streams may be more closely matches.

Figure 8:
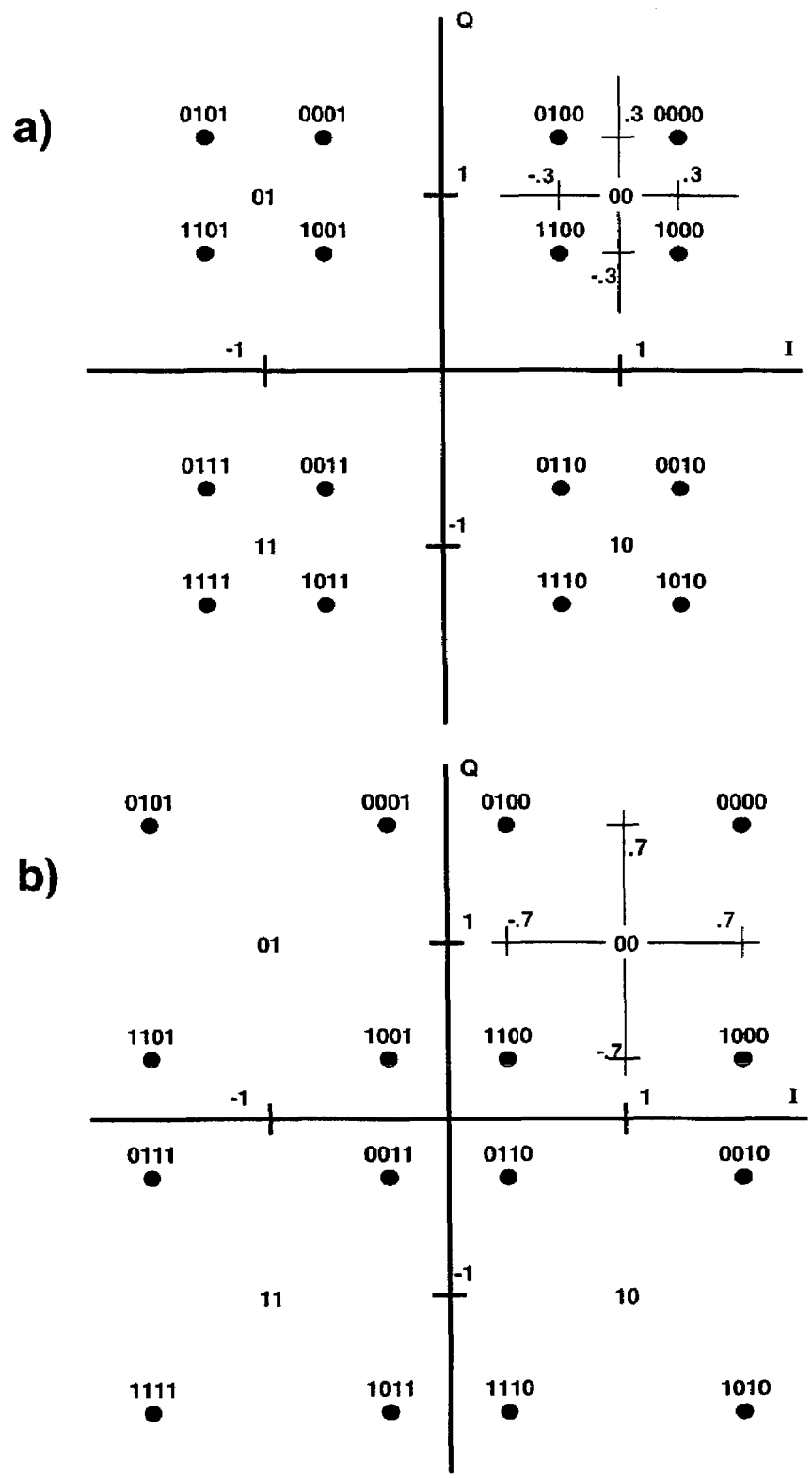
FIG. 8 is a diagram of a constellation illustrating the use of grouping factors to vary the relative bit rate performance of the different level signals in a heirarchial QAM system.

Referring to FIG. 8a, the gain of the variable gain amplifier (111 of FIG. 1) is conditioned to be 0.3. The resulting constellation points are spaced only 0.3 from the center point of the quadrant. One skilled in the art will recognize that in the constellation illustrated in FIG. 8a, the constellation points in a quadrant are further away from constellation points in other quadrants than in the constellation illustrated in FIG. 2a. Conversely, the constellation points within a quadrant are closer together than those illustrated in FIG. 2a. Such a system allows more accurate determination of which quadrant the level 1 data signal is in at the expense of less accurate determination of the constellation point of the level 2 data signal within the quadrant, thus, increasing the performance of the level 1 data stream and decreasing the performance of the level 2 data stream, when compared to the system of FIG. 2a.

Referring to FIG. 8b, the gain of the variable gain amplifier (111 of FIG. 1) is conditioned to be 0.7. The resulting constellation points are spaced 0.7 from the center point of the quadrant. One skilled in the art will recognize that in the constellation illustrated in FIG. 8b, the constellation points in a quadrant are closer to constellation points in other quadrants than in the constellation illustrated in FIG. 2a. Conversely, the constellation points within a quadrant are further apart than those illustrated in FIG. 2a. Such a system allows more accurate determination of the constellation point of the level 2 data signal within the quadrant at the expense of less accurate determination of which quadrant the level 1 data signal is in, thus, increasing the performance of the level 2 data stream and decreasing the performance of the level 1 data stream, when compared to the system of FIG. 2a.

By proper setting of the gain of the variable gain amplifier 111 (of FIG. 1), the grouping of the constellation points with each cluster may be placed optimally to more closely match the performance of the level 1 and level 2 data streams. It has been determined that for a 16 QAM transmission system transmitted through a non-linear direct satellite television channel, a grouping factor of around 0.6 to around 0.7 will more closely match the bit error rate performance of the level 1 and level 2 data streams. This will increase the overall performance of the transmission system as a whole.

What is claimed is:

1. A hierarchical QAM transmission system comprising:
   a hierarchical QAM transmitter responsive to a first and a second data stream, for transmitting a hierarchical QAM signal comprising a level 1 signal, representing the first data stream, having an uncoded first bit error rate performance, and a level 2 signal, representing the second data stream, having an uncoded second bit error rate performance lower than the first bit error rate performance;
   a hierarchical QAM receiver, coupled to the hierarchical QAM transmitter, for receiving the hierarchical QAM signal and producing received first and second data streams;

first error detection and correction circuitry processing the first data stream, for encoding the first data stream by a code having a first detection and correction power; and second error detection and correction circuitry processing the second data stream for encoding the second data stream by a code having a second error detection and correction power;

wherein the coded bit error rate performance of the first data stream is closer to the coded bit error rate performance of the second data stream than the uncoded bit error rate performance of the first data stream is to the uncoded bit error rate performance of the second data stream.

2. The system of claim 1 wherein the hierarchical QAM receiver comprises:

an input terminal for receiving the hierarchical QAM signal; and a first output terminal for producing the received first data stream and a second output terminal for producing the received second data stream;

and wherein:

the first error detection and correction circuitry comprises a first error detection and correction decoder coupled between the input terminal and the first output terminal of the hierarchical QAM receiver for decoding the encoded first data stream; and the second error detection and correction circuitry comprises a second error detection and correction decoder coupled between the input terminal and the second output terminal, for decoding the encoded second data stream.

3. The system of claim 2 wherein:

the first and second data streams are encoded with respectively different convolutional codes; and the first and second error detection and correction decoders respectively decode data encoded with the different convolutional codes.

4. The system of claim 3 wherein:

the first error detection and correction circuitry encodes the first data stream with a rate ½, constraint length 7, convolutional code, punctured to rate ⅞; and the second error detection and correction circuitry encodes the second data stream with a rate ½, constraint length 7, convolutional code; wherein the first error detection and correction decoder decodes the first data stream with a rate ½, constraint length 7, convolutional code, punctured to rate ⅞; and the second error detection and correction decoder decodes the second data stream with a rate ½, constraint length 7, convolutional code.

5. The system of claim 1 wherein:

the hierarchical QAM transmitter comprises:

a first input terminal coupled to a source of the first data stream and a second input terminal coupled to a source of the second data stream; and an output terminal for producing the hierarchical QAM signal; wherein the first error detection and correction circuitry comprises a first error detection and correction encoder coupled between the first input terminal and the output terminal of the hierarchical QAM transmitter for encoding the first data stream using a first error detection and correction code having the first error detection and correction power; and the second error detection and correction circuitry comprises a second error detection and correction encoder coupled between the second input terminal and the output terminal of the hierarchical QAM transmitter for encoding the second data stream using a second error detection and correction code having the second error detection and correction power greater than the power of the first error detection and correction code.

6. The system of claim 5 wherein:

the first and second error detection and correction encoders are convolutional code encoders encoding with respectively different convolutional codes.

7. The system of claim 6 wherein:

the first error detection and correction encoder encodes with a rate ½, constraint length 7, convolutional code, punctured to rate ⅞; and the second error detection/correction encoder encodes with a rate ½, constraint length 7, convolutional code.

8. The system of claim 5 wherein:

the hierarchical QAM receiver comprises:

an input terminal, coupled to the hierarchical QAM transmitter for receiving the hierarchical QAM signal; and a first output terminal for producing the received first data stream and a second output terminal for producing the received second data stream; wherein the first error detection and correction circuitry further comprises a first error detection and correction decoder coupled between the input terminal and the first output terminal for decoding the encoded first data stream; and the second error detection and correction circuitry further comprises a second error detection and correction decoder coupled between the input terminal and the second output terminal for decoding the encoded second data stream.

9. The system of claim 8 wherein:

the first and second error detection and correction encoders are convolutional code encoders encoding with respectfully different convolutional codes; and the first and second error detection and correction decoders are convolutional decoders decoding data encoded by the first and second error detection and correction encoders, respectively.

10. The system of claim 9 wherein:

the first error detection and correction encoder encodes, and the first error detection and correction decoder decodes a convolutional code with a rate ½, constraint length 7, punctured to rate ⅞;

the second error detection and correction encoder encodes and the second error detection and correction decoder decodes a convolutional code with a rate ½, constraint length 7, convolutional code.

11. The system of claim 8 wherein:

a satellite for receiving a signal from a ground station and broadcasting the signal to receiving stations; wherein:

the hierarchical QAM transmitter further comprises a satellite ground station transmitting antenna coupled to the output terminal of the hierarchical QAM transmitter, for transmitting the QAM signal to the satellite;

the hierarchical QAM receiver further comprises a satellite receiving antenna coupled to the input terminal of the hierarchical QAM receiver, for receiving the QAM signal from the satellite.

12. A hierarchical QAM transmitting system comprising:

a source of a first and second data stream;

a hierarchical QAM transmitter responsive to the first and second data stream, for transmitting a hierarchical QAM signal comprising a level 1 signal, representing the first data stream having an uncoded first bit error rate performance, and a level 2 signal, representing the second data stream having an uncoded second bit error rate performance lower than the uncoded first bit error rate performance;

first error detection and correction circuitry processing the first data stream, for encoding the first data stream by a code having a first detection and correction power; and second error detection and correction circuitry processing the second data stream, for encoding the second data stream by a code having a second error detection and correction power, wherein:

the coded bit error rate performance of the first data stream is closer to the coded bit error rate performance of the second data stream than the uncoded first bit error rate performance is to the uncoded second bit error rate performance.

13. The transmitting system of claim 12 wherein the hierarchical QAM transmitter comprises:

a first input terminal coupled to a source of the first data stream and a second input terminal coupled to a source of the second data stream; and an output terminal, for producing the hierarchical QAM signal; wherein the first error detection and correction circuitry comprises a first error detection and correction encoder coupled between the first input terminal and the output terminal of the hierarchical QAM transmitter, for encoding the first data stream using an error detection and correction code having the first error detection and correction power; and the second error detection and correction circuitry comprises a second error detection and correction encoder coupled between the second input terminal and the output terminal of the hierarchical QAM transmitter, for encoding the second data stream using an error detection and correction code having the second error detection and correction power greater than the power of the first error detection and correction power.

14. The transmitting system of claim 13 wherein:

the first and second error detection and correction encoders are convolutional code encoders encoding with respectively different convolutional codes.

15. The transmitting system of claim 14 wherein:

the first error detection and correction encoder encodes with a rate ½, constraint length 7, convolutional code, punctured to rate ⅞; and the second error detection and correction encoder encodes with a rate ½, constraint length 7, convolutional code.

16. A hierarchical QAM receiving system, comprising:

a source of a hierarchical QAM signal comprising a level 1 signal, representing a first data stream, having an uncoded first bit error rate performance, and encoded by a first code having a first error detection and correction power, and a level 2 signal, representing a second data stream, having an uncoded second bit error rate performance lower than the first bit error rate performance, and encoded by a second code having a second error detection and correction power; and a hierarchical QAM receiver coupled to the hierarchical QAM transmitter, for receiving the hierarchical QAM signal and producing received first and second data streams; wherein:

the coded bit error rate performance of the first data stream is closer to the coded bit error rate performance of the second data stream than the uncoded first bit error rate performance is to the uncoded second bit error rate performance.

17. The receiving system of claim 16 wherein the hierarchical QAM receiver comprises:

an input terminal, coupled to the hierarchical QAM signal source, for receiving the hierarchical QAM signal;

a first output terminal for producing the received first data stream and a second output terminal for producing the received second data stream;

a first error detection and correction decoder coupled between the input terminal and the first output terminal for decoding the encoded first data stream; and a second error detection and correction decoder coupled between the input terminal and the second output terminal for decoding the encoded second data stream.

18. The receiving system of claim 17 wherein:

the first and second data streams are encoded with respectively different convolutional codes; and the first and second error detection and correction decoders respectively decode data encoded with the different convolutional codes.

19. The receiving system of claim 18 wherein:

the first data stream is encoded with a rate ½, constraint length 7, convolutional code, punctured to rate ⅞; and the second data stream is encoded with a rate ½, constraint length 7, convolutional code; wherein the first error detection and correction decoder decodes the first data stream with a rate ½, constraint length 7, convolutional code, punctured to rate ⅞; and the second error detection and correction decoder decodes the second data stream with a rate ½, constraint length 7, convolutional code.

* * * * *